(12) United States Patent
Goldsmith et al.

(10) Patent No.: US 7,208,936 B2
(45) Date of Patent: Apr. 24, 2007

(54) SOCKET LID AND TEST DEVICE

(75) Inventors: Kurt R. Goldsmith, Tigard, OR (US); James J. Grealish, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/823,049

(22) Filed: Apr. 12, 2004

(65) Prior Publication Data

US 2005/0225315 A1    Oct. 13, 2005

(51) Int. Cl.
 *G01R 31/02* (2006.01)
(52) U.S. Cl. .................... 324/158.1; 324/754
(58) Field of Classification Search ........ 324/754–762; 439/482, 824, 66–78
See application file for complete search history.

(56) References Cited

U.S. PATENT DOCUMENTS

| | | | | |
|---|---|---|---|---|
| 4,978,912 A | * | 12/1990 | Vonder et al. .............. 324/756 |
| 5,283,605 A | * | 2/1994 | Lang-Dahlke .............. 324/754 |
| 5,436,570 A | * | 7/1995 | Tan ............................ 324/761 |
| 6,194,904 B1 | * | 2/2001 | Clayton et al. ............. 324/754 |
| 2003/0015779 A1 | | 1/2003 | Kohno et al. | |
| 2004/0048499 A1 | | 3/2004 | Adams | |

FOREIGN PATENT DOCUMENTS

EP    0 695 943 A2    7/1995

* cited by examiner

*Primary Examiner*—Vinh P. Nguyen
(74) *Attorney, Agent, or Firm*—Blakely, Sokoloff, Taylor & Zafman LLP

(57) ABSTRACT

Various embodiments related to an integrated lid and test device for a socket, such as a land grid array (LGA) socket, that functions as a lid, as a testing device, and/or as a pick and place lid. Specifically, the integrated lid may provide test capability, in manufacturing of the socket and/or a printed circuit board (PCB) such as a motherboard, onto which the socket is attached. Thus the integrated lid may allow for testing the socket and/or the PCB for correct assembly and connectivity without requiring removal of the integrated lid to insert a test device prior to testing, or removal of a test device and replacement of the lid after testing.

27 Claims, 4 Drawing Sheets

SOCKET LID AND TEST DEVICE

FIELD

Embodiments of the invention relate to electronic device interface socket testing, covering, and protection.

BACKGROUND

Electronic device sockets, such as sockets for receiving semiconductor chips and processors, may be inserted with a plastic cover or lid after manufacture to protect the socket and contacts therein during packaging, shipping, and attachment onto a printed circuit board (PCB). However, after manufacture such sockets may be tested prior to shipping, after attachment to a PCB, and/or during testing of the socket PCB combination. Thus, to perform a test, it is often necessary to remove the protection lid from the socket, insert a test device component into the socket, test the socket and/or socket PCB combination, remove the test device component, and replace the protective lid into the socket.

DETAILED DESCRIPTION

Figure 1:
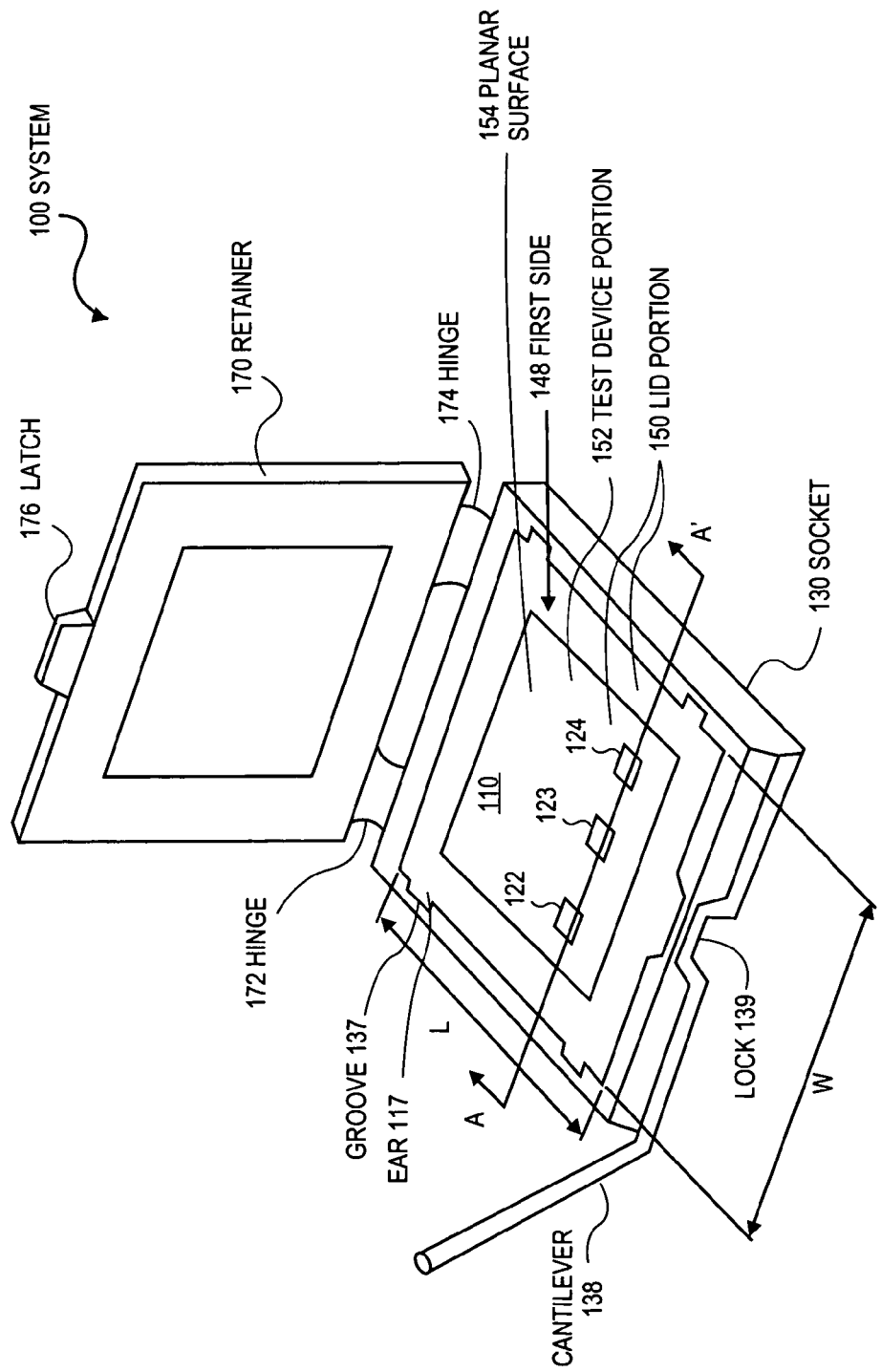
FIG. 1 is an angled top perspective view of a system including an apparatus having a lid portion and a test device portion in a socket.

FIG. 1 is an angled top perspective view of a system including an apparatus having a lid portion and a test device portion in a socket. FIG. 1 shows system 100 having apparatus 110 in socket 130. Apparatus 110 has lid portion 150, test device portion 152, and generally planar surface 154. In addition, test device portion 152 includes energy conduits 122, 123, and 124 to provide a response to a plurality of energy stimuli received by the energy conduits. Although apparatus 110 is shown in socket 130, according to embodiments, apparatus 110 may be a distinct and independent device from socket 130, such as by apparatus 110 being manufactured, tested, packaged, and sold separately from socket 130.

Next, FIG. 1 shows socket 130 having cantilever 138 with lock 139. In addition, socket 130 has groove 137 such as a groove for engaging ear 117 of apparatus 110 to align apparatus 110 within socket 130. It is considered that although FIG. 1 shows groove 137 and ear 117, various other appropriate structures may be used to align apparatus 110 within socket 130 such as various shapes, sizes, and numbers of alignment grooves, alignment ears, use of an orienting shape, and/or use of an indexing pin and pin receptacle. As shown in FIG. 1, system 100 may also include retainer 170 having latch 176 and coupled to socket 130 such as by hinges 172 and 174. Moreover, socket 130 and apparatus 110 may have one or more groove and ear combinations.

According to embodiments, generally planar surface 154 may be attached via a vacuum force attachment to a device, such as a pick-and-place (PnP) device. It is also contemplated that at surface 154 or another location of first side 148 of apparatus 110, may include at least one mechanical attachment point to be mechanically grappled by a device, such as a PnP device, to place apparatus 110 in socket 130 or to remove apparatus 110 from socket 130, or to place apparatus 110 at another location or on another surface, or in another socket as desired. Thus, apparatus 110 is designed to be removably coupled to socket 130, such as via an electronic chip interface, a cantilever, a forced insertion connection, an adhesive, a latch, a retaining lid, a distributed socket loading device, and a physical restraint. Specifically for example, apparatus 110 may be removably coupled to socket 130 by closing retainer 170 and engaging latch 176 with lock 139 using cantilever 138. Similarly, apparatus 110 may be removably coupled to socket 130 by apparatus 110 having structure similar to an electronic chip selected to be coupled to socket 130 and coupling to socket 130 with that structure.

Figure 2:
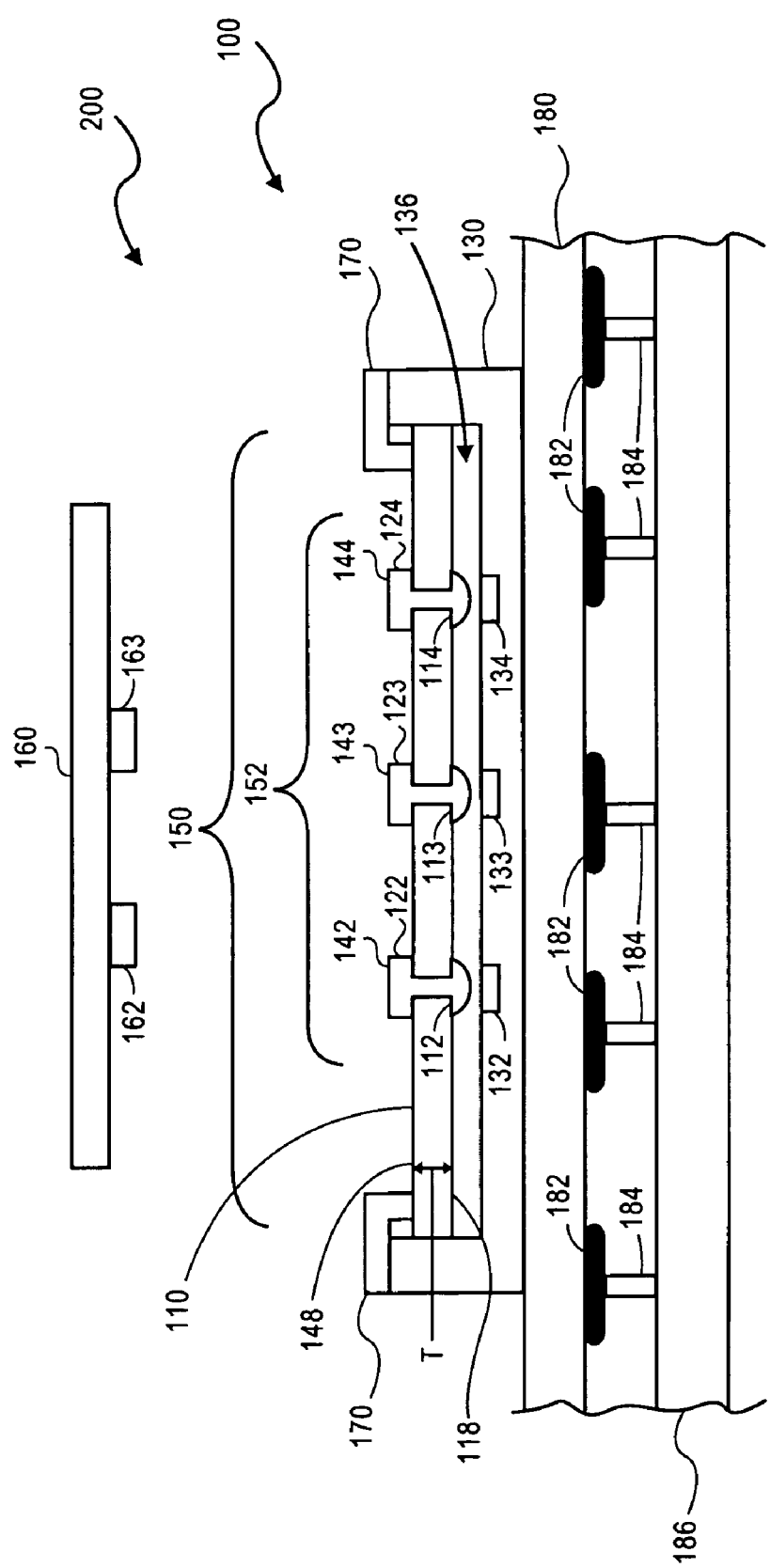
FIG. 2 is a sectional side view of FIG. 1 through line A–A'.

Also, in embodiments, lid portion 150 has a dimension at least large enough to cover or extend over socket 130 or a cavity of socket 130. Additionally, lid portion 150 may have a dimension at least large enough to protect and be designed to protect a plurality of contacts of socket 130 (e.g., such as contacts within a cavity of socket 130) from impact, dust, dirt, static buildup, and electrical contact from above or beyond first side 148. Specifically, socket 130 may include contacts to electronically couple to a computing device. For example, FIG. 2 is a sectional side view of FIG. 1 through line A–A'. FIG. 2 shows socket 130 having socket cavity 136, such as a cavity for lid portion 150 protect, and socket contacts 132, 133, and 134, such as contacts to electronically couple to a computing device.

It may be appreciated that socket 130 may be designed to and have features to provide a geographical and/or physical alignment between socket 130 and apparatus 110 or a computing device coupled to socket 130. Therefore, groove 137 and ear 117 shown in FIG. 1, and/or various other appropriate structures may be used to geographically and physically align apparatus 110 or a computing device within socket 130, such as is described above for aligning apparatus 110. More particularly, the design and features described above may align socket 130, socket cavity 136, and socket contacts 132–134 with locations, contacts, pins, zones, or other desired points or shapes of apparatus 110 or a computing device (e.g., such as by aligning socket contacts 132–134 with opposing contacts or pins of a computing device designed to form an electrical connection with contacts 132–134).

Thus, according to embodiments, apparatus 110 may function as a lid or cover of socket 130 and protect contacts 132–134 from impact, dust, dirt, static buildup, and electrical contact from above or beyond first side 148. For example, according to embodiments, apparatus 110 may function as a lid or cover, may provide test capability, and may function as a PnP attachment location for socket 130, such as a land grid array (LGA), a main grid array socket, an integrated circuit socket, a semiconductor device socket, a digital processor socket, and/or a memory module or chip socket.

Therefore, apparatus 110, lid portion 150, and/or test device portion 152 may include a material, and have a size and thickness to function as a lid or cover to socket 130 and protect contacts 132–134 from impact, dust, dirt, static buildup, and electrical contact from above or beyond first side 148. Similarly, apparatus 110, lid portion 150, and/or test device portion 152 may include a material function as a lid or cover to socket 130 and protect contacts 132–134 from impact, dust, dirt, static buildup, and electrical contact from above or beyond first side 148. Specifically, apparatus 110, lid portion 150, and/or test device portion 152 may be formed of or include a material such as a polyamide, a polyester, a polycarbonate, a Mylar®, a polyvinyl chloride (PVC), a cellulose acetate, or a plastic material sufficient to act as a lid or cover as described above.

According to embodiments, apparatus 110, lid portion 150, and/or test device portion 152 may have a size that is larger, smaller, or equal in width, length and depth as compared to the outer or inner dimension of socket 130, or a cavity thereof. For instance, FIG. 1 shows apparatus 110 and/or lid portion 150 having width W and length L of sufficient dimension to function as a lid or cover to socket 130. Specifically, width W may be a width between one centimeter and one meter, such as 2, 2.5, 2.75, 3, 3.5 4, or 5 centimeters in width. Similarly, length L may be a length between one centimeter and one meter, such as 2, 2.5, 2.75, 3, 3.5 4, or 5 centimeters in length. It is also contemplated that apparatus 110 may define an area between one square inch and four square feet in surface area. It is also contemplated that apparatus 110 may have thickness T, as shown in FIG. 2, of between 0.5 millimeters (mm) and 50 mm in thickness, such as by having thickness T of 2, 2.5, 2.75, 3, 3.5, or 4 mm in thickness.

FIG. 2 shows apparatus 110 having second side 118 having a dimension suitable to be removably coupled to socket 130. In accordance with embodiments, test device portion 152 may be integral with lid portion 150 and have energy conduits 122–124 to provide a response to a plurality of energy stimuli. Hence, one term for apparatus 110 may be an "integrated lid", referring to the integration in apparatus 110 of the functionality as a lid, as a testing device, and/or as a PnP lid.

For example, energy conduits 122–124 are shown with stimuli transfer zones 112, 113, and 114 designed to transfer energy stimuli between the zones and socket contacts 132–134, such as by electrical contact, electrically capacitive coupling, electrically inductive coupling, thermal coupling, radio frequency (RF) transmission, phototonic transmission (e.g., such as via light pipes), and/or infrared (IR) phototonic transmission between the zones and the contacts. Specifically, RF transmission and IR transmission may occur over free space between the zones and contacts, such as by transmission over free space within socket cavity 136.

According to embodiments, energy stimuli may be transferred between stimuli transfer zones 112–114 and/or energy conduits 122–124 and socket contacts 132–134 with or without causing a force actuation, compression, or compliance of contacts 132–134. Thus, energy conduits 122–124 may receive energy stimuli from contacts 132–134 and provide response derived from the energy stimuli back to contacts 132–134. It can be appreciated that stimuli transfer zones 112–114 may form electrical contact or be electrically attached to contacts 132–134, such as by touching or contact with or without causing a force actuation, compression, or compliance of contacts 132–134. For instance, energy conduits 122–124 may include electrical contacts, electrical conductors, electrical semiconductors, silicon chips, electronic devices, active electronic devices, field effect transistors (FETs), electrical signal traces, printed circuit boards (PCBs), a photonic energy receiver, a photonic energy conduit, a photonic device, light pipes, an analog device, a capacitor, a resistor an inductor, a thermal coupling, a thermal conduit, and/or an array of a number of capacitors and/or resistors. Moreover, it is contemplated that the energy conduits may be disposed within apparatus 110 (e.g., such as by being disposed between first side 148 and second side 118) or may extend beyond first side 148 and/or second side 118.

According to embodiments, each of energy conduits 122–124 may have a location and a physical dimension to receive at least one type of energy stimuli from a first location (e.g., such as from one of contacts 132–134) and respond to the energy stimuli with an energy response to the same and/or a different location (e.g., such as by responding to the same contact of contacts 132–134 from which the stimuli was received, and/or responding to that contact as well as another of contacts 132–134).

Moreover, stimuli transfer zones 112–114, energy conduits 122–124, and socket contacts 132–134 may be formed of or include an electronically conductive connection, a conductive filler, a trace pad, a trace, copper, gold, silver, aluminum, titanium, alloy, metal, and/or other appropriate material. Likewise, stimuli transfer zones 112–114, energy conduits 122–124, and socket contacts 132–134 may be formed to or include a shape and thickness to form a sufficient electronically conductive pad, contact, energy conduit, zone, path, location to function as described herein.

Specifically, apparatus 110 may perform as an integrated lid to provide test capability, in manufacturing of the socket and/or a printed circuit board (PCB) such as a motherboard, onto which the socket is attached. Thus the integrated lid may allow for testing the socket and/or the PCB for correct assembly and connectivity without requiring removal of the integrated lid to insert a test device prior to testing, or removal of a test device and replacement of the lid after testing.

For instance, FIG. 2 also shows PCB 180 that physically and electronically supports socket 130, and may physically and electronically support a variety or other similar sockets, electronic device sockets, and other electronic devices. Socket 130 may be attached to PCB 180 physically and electronically using adhesive bonding, heat bonding, soldering, solder bump or joint technology, and/or various other appropriate structures and methods. For example, PCB 180 may be a computer "motherboard", computer graphics card, computer input/output (I/O) card, hard disk controller card, computer network card, computer memory controller, an electronic board having conductive traces, a computer electronic board, a memory module, or computer chip board, and/or another computer or electronic device or device interface.

Therefore, socket 130 may be a socket designed to couple to and provide electronic or other interface between PCB 180 and a computing device, an electronic device, an active electronic device, another electronic circuit board, a FET, a photonic device, an analog device, an integrated circuit, a processor, a central processing unit, a memory chip, a co-processor, and/or a silicon chip.

In addition, FIG. 2 shows tester 186 having probes 184, such as for providing energy stimulus to PCB contacts 182. Contacts 182 may be PCB electrical devices and components such as a conductive trace (e.g., such as a conductive trace that is part of a PCB), a conductive node, a conductive pad, and/or a conductor on or at a surface of PCB 180.

FIG. 2 also shows optional probe 160 having optional probe contacts 162 and 163. Contacts 162 and 163 may be contacts such as described herein with respect to contacts 132–134 and/or energy conduits such as described herein with respect to energy conduits 122–124. According to embodiments, tester 186 and/or optional probe 160 may have a size and number of probes and/or probe contacts to transmit energy stimuli between the probes and or probe contacts and apparatus 110 and/or PCB 180 as described herein. For example, tester 186 and/or optional probe 160 may have a size of between one square inch and four square feet in surface area and may have between 1 and 40,000 probes and/or probe contacts, such as by having 1100 or 775 probes and/or probe contacts.

According to embodiments, tester 186, optional probe 160, and apparatus 110 may be used to test socket 130, contacts 132–134, PCB 180, PCB contacts 182 and/or other electronic equipment, devices, components, or devices attached to PCB 180. For example, tester 186 and/or optional probe 160 may provide energy stimulus to apparatus 110 and/or PCB contacts 182 and take measurements therefrom to conduct tests as described above. Specifically, FIG. 2 shows energy conduit devices 142, 143, and 144, which may be part of energy conduits 122, 123, and 124, respectively. According to embodiments, energy stimulus as described herein may be transferred between energy conduit devices 142–144 and optional probe 160 such as described herein with respect to transferring energy stimuli between stimuli transfer zones 112–114 and contacts 132–134. Specifically, electrical or other energy stimulus may be transferred between contacts/conduits 162 and 163, and energy conduit devices 142 and 143.

According to embodiments, test device portion 152 may have various appropriate numbers of stimuli transfer zones (e.g., such as stimuli transfer zones 112–114 and/or energy conduit devices (e.g., such as energy conduit devices 142–144) to transmit energy stimuli between socket 130 and/or optional probe 160 as described herein. For example, test device portion 152 may have a size of between 1 and 40,000 stimuli transfer zones and/or energy conduit devices, such as by having 1100 or 775 stimuli transfer zones and/or energy conduit devices.

Thus, testing of socket 130, PCB 180, PCB contacts 182, and/or electronic devices or conductors as described above may be performed using apparatus 110, such as by providing energy stimulus including electrical energy, photonic energy, magnetic energy, thermal energy, X-ray energy, infrared energy, and/or radio frequency energy to stimuli transfer zones 112–114 and/or energy conduit devices 142–144, and receiving a response from those stimuli. Specifically, a response to those stimuli may be returned from where the stimuli came or may be returned via one or more other of stimuli transfer zones 132–134 and/or energy conduit devices 142–144.

In one embodiment, apparatus 110 may be removably coupled to a land grid array (LGA) socket 130 and thus, apparatus 110 may be described as a land grid array (LGA) socket lid or cover having protection functionality, PnP lid functionality, as well as the additional function of providing test capability, in manufacturing to test the socket for correct assembly and connectivity. Therefore, apparatus 110 may serve as an LGA socket cover device having the additional function of enabling the testing of the socket and/or enabling testing of the LGA socket during computer "motherboard" manufacturing without requiring removal of the lid and insertion of the test device prior to testing and then removal of the test device and replacement of the lid after testing.

Figure 3:
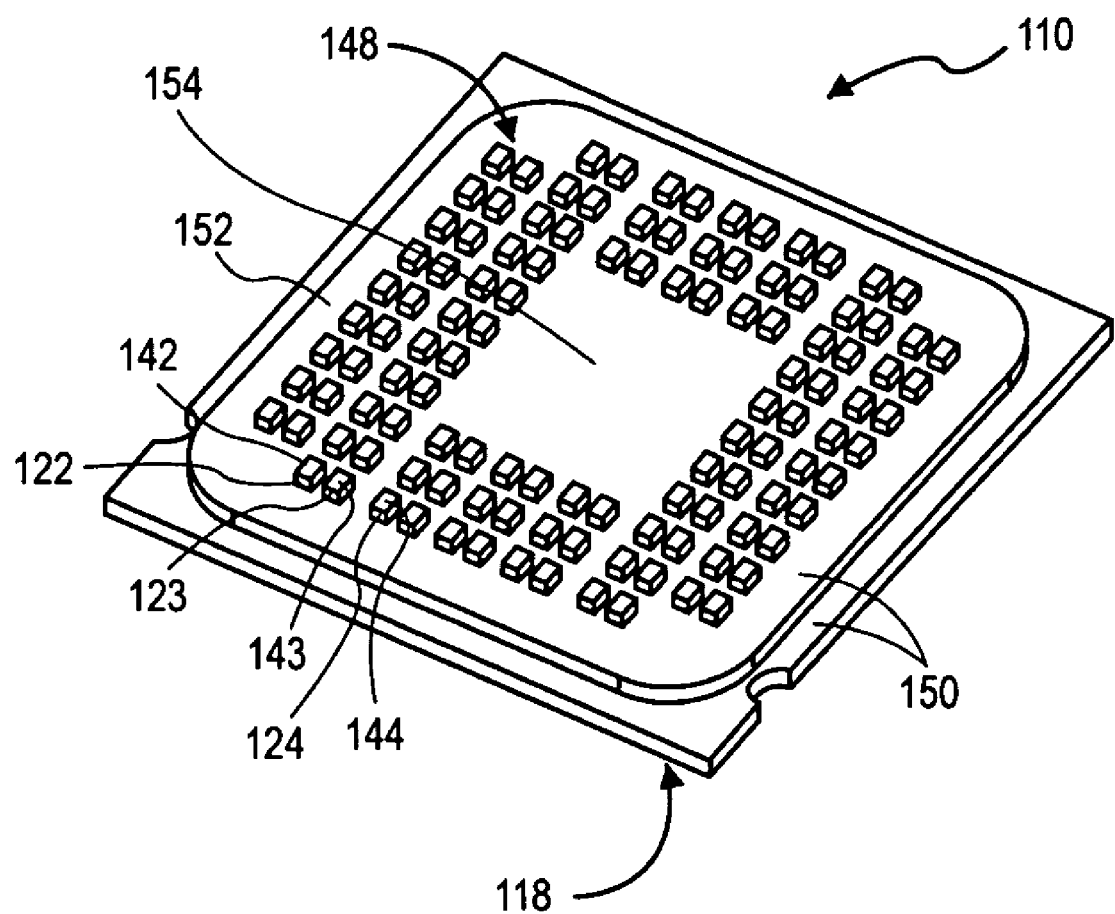
FIG. 3 is an angled top perspective view of an apparatus having a lid portion and a test device portion.

For example, FIG. 3 is an angled top perspective view of an apparatus having a lid portion and a test device portion. FIG. 3 shows apparatus 110 detached, separated, or uncoupled from a socket, such as socket 130. Apparatus 110 is shown with first side 148, second side 118, test device portion 152, lid portion 150, and generally planar surface 154. FIG. 3 also shows energy conduits 122–124, having contacts 142–144. According to embodiments, energy conduits 122–124 may transfer energy stimuli between second side 118 and first side 148, such as between contacts on second side 118 (e.g., contacts not shown in FIG. 3 but as described above for contact 132–134) and contacts 142–144. Thus, apparatus 110 may be transferring between, returning, and/or providing a response to energy stimuli received from optional probe 160 via contacts 142–144 and/or PCB 180 contacts on second side 118. As such, apparatus 110 may be inserted into a LGA or other socket to provide protection, PnP functionality, and test capability for the socket and/or a PCB to which the socket is or is to be attached.

Figure 4:
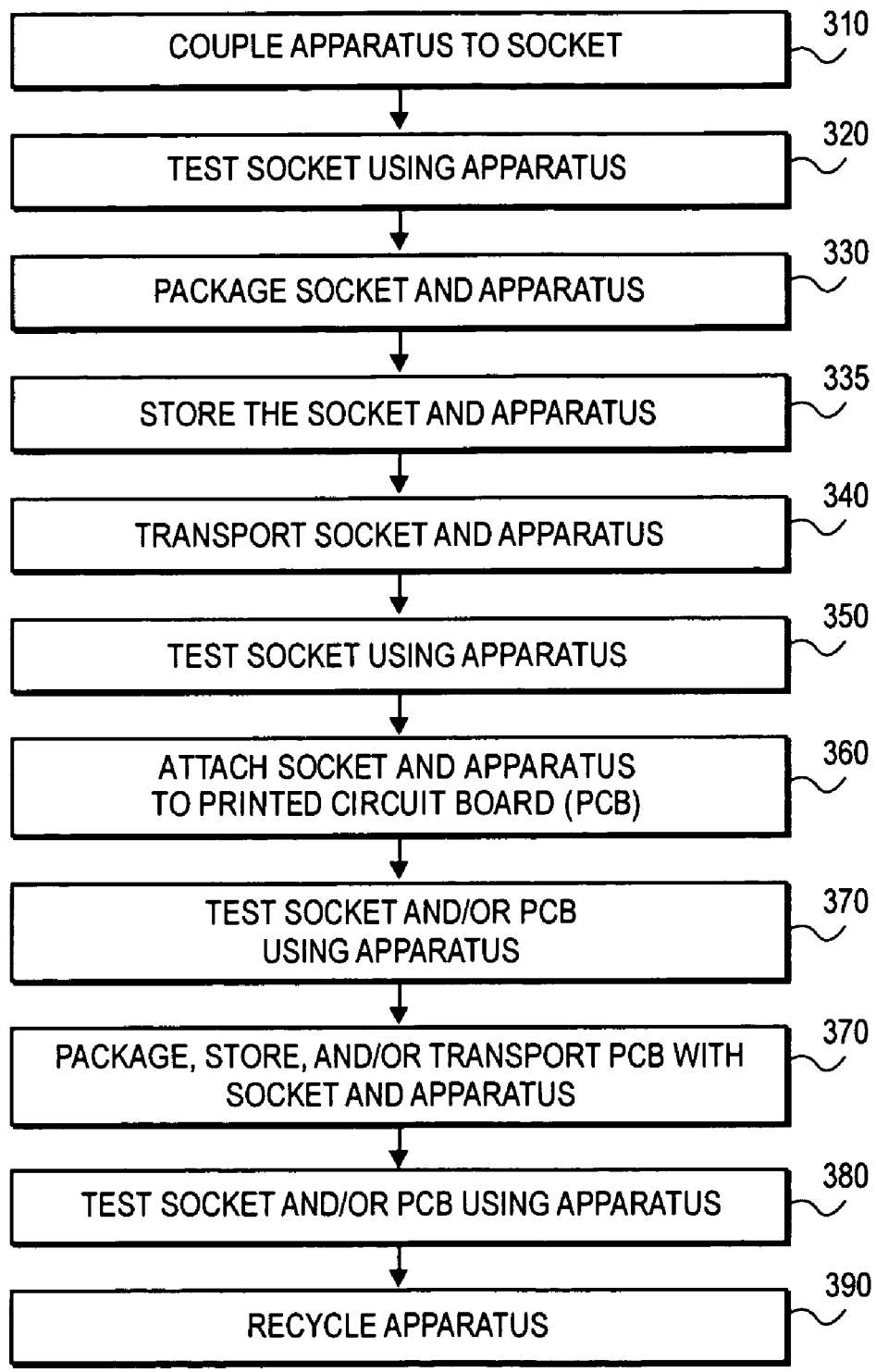
FIG. 4 is a flow diagram of a process to couple an apparatus having a lid portion and a test device portion to a socket, transport the socket and apparatus, and test the socket using the apparatus.

For instance, FIG. 4 is a flow diagram of a process to couple an apparatus having a lid portion and a test device portion to a socket, transport the socket and apparatus, and test the socket using the apparatus. At block 310, a device having electronic socket testing functionality is removably coupled to a socket, where the socket has a plurality of contacts to electronically couple to a computing device. According to embodiments, the coupling between the apparatus and the socket is sufficient to transfer energy stimuli between the apparatus and the contacts without causing a force actuation, a force compression, or a force compliance of the contacts. For example, block 310 may include a removable coupling such as described above with respect to coupling of apparatus 110 to socket 130. It is also contemplated that at block 310, coupling may include the apparatus covering at least a cavity of the socket including the contacts, such as to protect the contacts from impact, dust, dirt, electrical static, and/or other electrical contact or signals from outside the apparatus.

Thus, apparatus 110 may protect socket contacts during shipping of the socket and/or a PCB or motherboard on which the socket is mounted. In addition, apparatus 110 may provide PnP (Pick and Place) capabilities via board assembly equipment for PnP of the socket and/or a PCB or motherboard on which the socket is mounted.

At block 320, the socket is tested in a test that includes the apparatus, while the apparatus and socket are coupled together. The testing at block 320 may include stimulating a plurality of energy conduits of the apparatus and the apparatus responding to the stimulating by providing a response to the stimuli. Specifically, the stimulating may include transmitting electricity or electrical signals or other energy stimuli such as described above with respect to probes 184 and contacts/conduits 162 and 163, and responding by returning electricity, electrical signals, and/or energy stimuli as described above with respect to apparatus 110, energy conduits 122–124, contacts 132–134, and contacts/conduits 162–163. Specifically, testing may include tests such as a boundary scan test (boundary scan), a built-in self test (BIST), a digital test using dual FET transistors, an analog test using embedded resistors and/or capacitors (e.g., such as embedded single capacitors or embedded capacitors and/or resistors in an array), a test including response to energy stimuli using FETs, a test including responding to stimuli using a capacitor or a resistor, a test to detect power nodes, a self test, a thermal test, a thermal profile test, a test to detect electrical shorts, a test to detect electrical opens, a test for proper assembly, a test for proper connectivity, a test for proper continuity, a PCB trace test, a power-up test, an enable power-test, an unpowered test, a ground node detection test, a test including response to stimuli using an array of a number of capacitors and/or resistors, and/or a test including responding to stimuli using single capacitor and/or resistor.

In accordance with embodiments, block 310 and/or block 320 may be part of or occur after manufacture of the socket, such as by being part of a process for manufacturing and manufacture testing of socket 130.

At block 330, the socket and apparatus coupled together may be packaged, such as being packaged for storage, sale, and/or transportation. At block 335, the socket and apparatus coupled together may be stored, such as by being stored with or without being packaged, such as at block 330, and with or without being tested, such as at block 320.

At block 340, the socket and apparatus coupled together are transported, such as by being transported alone, with other socket and apparatus combinations, to a different room in a facility, to a different facility, in a box, by a motor vehicle, by boat, by air transport, and/or by various other methods for transporting a socket as described herein (e.g., such as socket 130). Thus, apparatus 110 may provide PnP (Pick and Place) capabilities for the socket and protect socket contacts during shipping and handling of the socket.

At block 350, the socket is tested where the testing includes using the apparatus while the apparatus and socket are coupled together. Testing at block 350 may be testing as described above with respect to block 320. Moreover, it is contemplated that testing at block 350 may occur without testing having occurred at block 320, packaging having occurred at block 330, and/or storing having occurred at block 335.

Similarly, it is contemplated that transporting at block 340 may occur without storing, such as described at block 335.

At block 360, the socket and apparatus coupled together may be attached to a printed circuit board (PCB), such as by soldering electrical components or contacts or the socket to electrical components or contacts of the PCB. Thus, it is considered that block 360 may include attaching a socket to a PCB as described above with respect to socket 130 and PCB 180. Thus apparatus 110 may provide Pick and Place (PnP) capabilities via board assembly equipment for PnP of system 100 (e.g., including apparatus 110 and socket 130) on to the PCB 180 and protect the socket contacts during the PCB assembly and handling processes.

At block 370, the socket, PCB, and/or socket and PCB may be tested in a test that includes using the apparatus. The testing at block 370 may include testing as described above with respect to block 320. Moreover, the testing at block 370 may include testing as described above with respect to tester 186 and optional probe 160 of FIG. 2. Thus, apparatus 110 may become a test device during manufacturing, including during manufacturing of the socket, such as by testing at block 320, and during manufacturing of the PCB (e.g. a motherboard), such as by testing at block 370. Thus, these tests may be executed on the socket using test equipment both at the PCB assembly site and at the socket-manufacturing site.

At block 380, the PCB with the socket attached to the PCB and apparatus coupled to the socket may be packaged, stored, and/or transported. Block 380 may include packaging, storing, and/or transporting as described above with respect to blocks 330, 335, and/or 340. Moreover, at block 380, packaging, storing, and/or transporting may be performed alone or with only one other of processes. Thus, apparatus 110 may provide protection to the socket 130 contacts. It is also contemplated that the processes of block 380 may be performed without the apparatus coupled to the socket, such as by removing the apparatus from the socket, however no protection to the socket contacts would be provided. At block 385, the socket, PCB, and/or socket and PCB may be tested using a test that includes the apparatus and socket coupled together. Testing at block 385 may include testing such as is described above with respect to block 370. Moreover, testing at block 385 may occur without any or all of packaging, storing, and/or transporting at block 380 (e.g., such as if block 385 is a retest of the process performed at block 370).

At block 390, the apparatus may be recycled. For example, after testing the socket and/or PCB, the apparatus may be removed from the socket to be removably coupled to another socket. Thus, the apparatus may be removed from the current socket, packaged, stored, and/or transported to a location to be coupled to a different socket which then may experience any and/or all of the blocks described above for FIG. 4.

In addition, according to embodiments, at block 390, the apparatus may be shipped with the socket and PCB (e.g., such as by shipping the PCB with the socket coupled to it, while the apparatus and socket are also coupled together). Hence, subsequent testing can be performed on the socket and/or PCB after block 390, such as testing described above for block 320 performed after shipping of the PCB; after installation of the PCB into an electronic device (e.g., such as a computer, computer network client computer, or computer network server computer); during maintenance of the PCB, socket, or an electronic device the PCB is within; during repair of the PCB, socket, or an electronic device the PCB is within; during post sales support of the PCB, socket, or an electronic device the PCB is within.

Moreover, it is contemplated that block 390 may occur after block 350, or after 370, such as to forego further testing using the apparatus after block 320, block 350, block 370, or any other block of FIG. 4.

Thus, use of apparatus 110 to test socket 130 may decrease the risks of damaging socket contacts and decrease the number of insertions the contacts experience due to testing of the socket and/or motherboard (e.g., such as sockets can be specified for a maximum number of insertions). In addition, use of apparatus 110 to protect the socket contacts, provide PnP capability and test socket 130 may simplify the manufacturing process and may lead to a cheaper process for the manufacturing of sockets and/or motherboards by reducing the number of removals and insertions into the socket. Furthermore, use of apparatus 110 to test socket 130 may limit opportunities for damaging sockets and/or connectors by reducing the number of removals and insertions into the socket. Moreover, use of apparatus 110 to test socket 130 may provide a socket supplier with better opportunities to test sockets and/or connectors prior to shipping by allowing for testing without removals and insertions into the socket.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. An apparatus comprising:
 a first side including a generally planar surface and one of conductive pads and trace pads surrounding the generally planar surface such that the generally planar surface is accessible to a pick-and-place vacuum force attachment;
 a lid portion including the first side and having a dimension at least large enough to cover or extend over a plurality of contacts of a socket;
 a test device portion integral with the lid portion, the test device portion having a plurality of energy conduits to provide a response to a plurality of energy stimuli to a second side disposed opposite the first side.

2. The apparatus of claim 1, wherein the lid portion includes a dimension to protect the plurality of contacts from impact, dust, and electrical coupling from the first side.

3. The apparatus of claim 1, wherein the energy conduits includes a plurality of stimuli transfer zones to receive a plurality of energy stimuli from the second side and to provide a response to the plurality of energy stimuli to the second side.

4. The apparatus of claim 1, wherein the energy conduits are to transfer a plurality of energy stimuli between the second side and the first side.

5. The apparatus of claim 4, wherein the stimuli transfer zones are to transfer the energy stimuli between the zones and the contacts by one of electrical contact, electrically capacitive coupling, a thermal coupling, radio frequency transmission over free space, infrared transmission over free space, and photonic transmission over free space.

6. The apparatus of claim 5, wherein the stimuli transfer zones are to couple to the contacts by a coupling without causing a force actuation, compression, or compliance of the contacts.

7. The apparatus of claim 5, wherein the stimuli transfer zones are to couple to the contacts by a coupling causing a force actuation, compression, or compliance of the contacts.

8. The apparatus of claim 1, wherein the apparatus further comprises a thickness to allow a retainer of the socket to close over the apparatus.

9. An apparatus comprising:
a first side forming a generally planar surface and a second side disposed opposite the first side, the second side having a dimension suitable to be removably coupled to a socket;
a lid portion including the first side and having a dimension at least large enough to cover a cavity and a plurality of contacts of the socket;
a test device portion integral with the lid portion, the test device portion having a plurality of energy conduits to receive a plurality of energy stimuli from a plurality of contacts of the socket and to provide a response to the contacts; and
the apparatus having a size that is smaller or equal in depth as compared to a depth of an inner dimension of the cavity.

10. The apparatus of claim 9, wherein the first side includes one of a generally planar surface adapted to be attached to via a vacuum force attachment to pick up and place the apparatus on the socket, and at least one mechanical attachment point to be mechanically grappled to by a device to pick up and place the apparatus on the socket.

11. The apparatus of claim 9, wherein the first side includes one of a generally planar surface adapted to be attached to via a vacuum force attachment to pick up and place the apparatus and the socket on a printed circuit board, and at least one mechanical attachment point to be mechanically grappled to by a device to pick up and place the apparatus and the socket on a printed circuit board.

12. The apparatus of claim 9, wherein the second side is to removably couple to a socket via at least one of an electronic chip interface, a cantilever, a forced insertion connection, an adhesive, a latch, a retaining lid, a distributed socket loading device, and a physical restraint.

13. The apparatus of claim 9, wherein the second side has a plurality of contacts to electrically coupled to the contacts of the socket.

14. The apparatus of claim 9, wherein the energy stimuli includes at least one of an electrical energy, a photonic energy, a magnetic energy, a thermal energy, an x-ray energy, an infrared energy, and a radio frequency energy.

15. The apparatus of claim 9, wherein the lid portion includes at least one of an alignment groove, an alignment ear, an orienting shape, an indexing pin or pin receptacle.

16. The apparatus of claim 9, wherein the plurality of energy conduits include at least one of an electrical contact, an electrical conductor, an electrical semiconductor, a silicon chip, an electronic device, an active electronic device, a field effect transistor (FET), an electrical signal trace, a printed circuit board (PCB), an area for receiving photonic energy, a photonic energy conduit, a photonic device, an analog device, a capacitor, a resistor, an inductor, a thermal conduit, and a plurality of capacitors and/or resistors.

17. The apparatus of claim 9, wherein the energy conduits include one of conduits disposed within the apparatus between the first side and the second side, and conduits disposed on the first side.

18. The apparatus of claim 9, wherein each conduit has a location and a physical dimension to receive at least one of the plurality of energy stimuli at a first location of the second side and respond to the at least one of the plurality of energy stimuli to the first location or to a second location of the second side.

19. The apparatus of claim 9, wherein the energy conduits include contacts on the first side to receive stimuli or to provide a response to stimuli received by the apparatus.

20. The apparatus of claim 9, wherein the lid includes a material suitable to protect the plurality of contacts from impact damage, dust, dirt, and additional electrical coupling.

21. The apparatus of claim 9, wherein the depth allows a retainer of the socket to close over the apparatus.

22. A system comprising:
a printed circuit board (PCB);
a socket coupled to the PCB, the socket having a cavity and a plurality of contacts within the cavity to electronically couple to a computing device;
an apparatus removably coupled to the socket, the apparatus comprising:
a lid portion having a dimension at least large enough to cover the cavity; and
a test device portion integral with a lid portion, the test device portion having a plurality of energy conduits electronically coupled to the plurality of contacts of the socket to provide a response to the contacts for a plurality of energy stimuli received from the contacts, wherein the apparatus has a size that is smaller or equal in depth as compared to a depth of an inner dimension of the cavity.

23. The system of claim 22, wherein the energy conduits are to respond to a plurality of electronic signals received from the contacts.

24. The system of claim 22, wherein the socket has a cavity to removably couple to one of a computing device, an electronic device, an active electronic device, a field effect transistor (FET), a photonic device, an analog device, an electrical contact, an electrical conductor, an electrical semiconductor, and a silicon chip.

25. The system of claim 22, wherein the computing device includes one of an electronic device, an active electronic device, a field effect transistor (FET), a photonic device, an analog device, an electrical contact, an electrical conductor, an electrical semiconductor, and a silicon chip.

26. The system of claim 22, wherein the lid portion includes a dimension suitable to protect the plurality of contacts from impact, dust, and electrical coupling from the first side.

27. The system of claim 22, wherein the depth allows a retainer of the socket to close over the apparatus.

* * * * *